United States Patent
Shin et al.

(10) Patent No.: US 9,685,516 B2
(45) Date of Patent: Jun. 20, 2017

(54) ELECTRONIC DEVICE HAVING GRAPHENE-SEMICONDUCTOR MULTI-JUNCTION AND METHOD OF MANUFACTURING THE ELECTRONIC DEVICE

(71) Applicant: Samsung Electronics Co., Ltd., Suwon-si, Gyeonggi-do (KR)

(72) Inventors: Hyeonjin Shin, Suwon-si (KR); Sangwoo Kim, Yongin-si (KR); Kanghyuck Lee, Suwon-si (KR); Hyejung Park, Seoul (KR); Eunbi Cho, Suwon-si (KR)

(73) Assignees: Samsung Electronics Co., Ltd., Gyeonggi-do (KR); Research and Business Foundation Sungkyunkwan University, Gyeonggi-do (KR)

( * ) Notice: Subject to any disclaimer, the term of this patent is extended or adjusted under 35 U.S.C. 154(b) by 0 days.

(21) Appl. No.: 14/657,306

(22) Filed: Mar. 13, 2015

(65) Prior Publication Data
US 2015/0332920 A1    Nov. 19, 2015

(30) Foreign Application Priority Data
May 19, 2014    (KR) .......................... 10-2014-0059966

(51) Int. Cl.
*H01L 29/267*    (2006.01)
*H01L 21/324*    (2006.01)
(Continued)

(52) U.S. Cl.
CPC ........ *H01L 29/267* (2013.01); *H01L 21/0242* (2013.01); *H01L 21/0259* (2013.01);
(Continued)

(58) Field of Classification Search
None
See application file for complete search history.

(56) References Cited

U.S. PATENT DOCUMENTS

2013/0146846 A1* 6/2013 Adkisson .......... H01L 29/66045
257/27
2013/0255764 A1* 10/2013 Naito ................ H01L 31/02242
136/256
(Continued)

FOREIGN PATENT DOCUMENTS

JP    2013232478 A    11/2013
KR    20070065080 A    6/2007
(Continued)

OTHER PUBLICATIONS

Yu, Woo Jong, et al., "Highly efficient gate-tunable photocurrent generation in vertical heterostructures of layered materials," Nature Nanotechnology, vol. 8, 2013, pp. 952-958.
(Continued)

*Primary Examiner* — Xiaoming Liu
(74) *Attorney, Agent, or Firm* — Harness, Dickey & Pierce, P.L.C.

(57) ABSTRACT

Example embodiments relate to an electronic device having a graphene-semiconductor multi-junction and a method of manufacturing the electronic device. The electronic device includes a graphene layer having at least one graphene protrusion and a semiconductor layer that covers the graphene layer. A side surface of each of the at least one graphene protrusion may be uneven, may have a multi-edge, and may be a stepped side surface. The graphene layer includes a plurality of nanocrystal graphenes. The graphene layer includes a lower graphene layer having a plurality of nanocrystal graphenes and the at least one graphene protrusion that is formed on the lower graphene layer. The semiconductor layer may include a transition metal dichal-
(Continued)

cogenide (TMDC) layer. Each of the at least one graphene protrusion may include a plurality of nanocrystal graphenes.

25 Claims, 7 Drawing Sheets

(51) Int. Cl.
*H01L 29/786* (2006.01)
*H01L 21/02* (2006.01)
*H01L 29/66* (2006.01)
*H01L 31/028* (2006.01)
*H01L 29/16* (2006.01)

(52) U.S. Cl.
CPC .... *H01L 21/0262* (2013.01); *H01L 21/02422* (2013.01); *H01L 21/02425* (2013.01); *H01L 21/02444* (2013.01); *H01L 21/02499* (2013.01); *H01L 21/02505* (2013.01); *H01L 21/02513* (2013.01); *H01L 21/02527* (2013.01); *H01L 21/02568* (2013.01); *H01L 21/02614* (2013.01); *H01L 21/02623* (2013.01); *H01L 21/02628* (2013.01); *H01L 21/02664* (2013.01); *H01L 21/324* (2013.01); *H01L 29/1606* (2013.01); *H01L 29/66015* (2013.01); *H01L 31/028* (2013.01); *Y02E 10/547* (2013.01)

(56) References Cited

U.S. PATENT DOCUMENTS

| 2014/0014030 A1* | 1/2014 | Tour | C30B 25/186 |
| | | | 117/97 |
| 2015/0083206 A1* | 3/2015 | Novoselov | B82Y 30/00 |
| | | | 136/256 |
| 2015/0248972 A1* | 9/2015 | Tang | B82Y 30/00 |
| | | | 361/502 |

FOREIGN PATENT DOCUMENTS

| KR | 20080055538 A | 6/2008 |
| KR | 20110066311 A | 6/2011 |
| KR | 20130117300 A | 10/2013 |

OTHER PUBLICATIONS

Lee, Yi-Hsien, et al., "Synthesis of LArge-Area $MoS_2$ Atomic Layers with Chemical Vapor Deposition," Advanced Materials, vol. 24, 2012, pp. 2320-2325.

Li, Q., et al. "Polycrystalline Molybdenum Disulfide ($2H$—$MoS_2$) nano- and Microribbons by Electrochemical/Chemical Synthesis," Nano Letters, vol. 4, No. 2, 2004, pp. 277-281.

* cited by examiner

+ ANNEALING

ELECTRONIC DEVICE HAVING GRAPHENE-SEMICONDUCTOR MULTI-JUNCTION AND METHOD OF MANUFACTURING THE ELECTRONIC DEVICE

RELATED APPLICATIONS

This application claims the benefit of priority from Korean Patent Application No. 10-2014-0059966, filed on May 19, 2014, in the Korean Intellectual Property Office, the disclosure of which is incorporated herein in its entirety by reference.

BACKGROUND

1. Field

Example embodiments relate to devices including graphene, methods of manufacturing the devices, electronic devices having a graphene-semiconductor junction and/or methods of manufacturing the electronic devices.

2. Description of the Related Art

Graphene and molybdenite ($MoS_2$) are materials that have recently drawn attention for their improved intrinsic properties. Graphene and $MoS_2$ have many properties; for example, graphene is stronger than steel, may be easily bent, and conducts electricity better than copper. $MoS_2$ has particular electronic properties. The possibility of overcoming physical limitations of a transistor and a silicon chip has increased through the study of the two materials. Graphene has a better conductivity than $MoS_2$, whereas $MoS_2$ has better semiconductor properties. $MoS_2$ also has a desirable energy band in an electronic structure. Accordingly, $MoS_2$ may be easily switched from an ON state to an OFF state, thereby reducing electricity consumption. As a result, when the two materials are used together, the advantages of the two materials may be fully exploited.

SUMMARY

Example embodiments relate to electronic devices having an increased graphene-semiconductor junction region.

Example embodiments relate to methods of manufacturing the electronic devices.

Additional example embodiments will be set forth in part in the description which follows and, in part, will be apparent from the description, or may be learned by practice of the example embodiments.

According to at least one example embodiment, an electronic device includes a graphene layer that includes one or more graphene protrusions, and a semiconductor layer covering the graphene layer. A side surface of each of the one or more graphene protrusions may be uneven and may have a multi-edge. Each of the one or more graphene protrusions may have a stepped side surface.

An example graphene layer may include a plurality of nanocrystal graphenes. The graphene layer may include a lower graphene layer that includes a plurality of nanocrystal graphenes, and one or more graphene protrusions on the lower graphene layer.

The one or more graphene protrusions may be spaced apart from each other on the lower graphene layer. Heights of the one or more graphene protrusions may be the same or different from each other. The semiconductor layer may include a transition metal dichalcogenide (TMDC) layer.

Each or one or more of the plurality of graphene protrusions may include a plurality of nanocrystal graphenes.

Heights of the plurality of graphene protrusions may be the same or different from each other.

The graphene layer may include a lower graphene layer that includes the plurality of nanocrystal graphene sheets and the plurality of graphene protrusions that are formed on the lower graphene layer.

The lower graphene layer may include first and second graphene layers that are sequentially stacked.

According to at least one example embodiment, a method of manufacturing an electronic device includes forming on a first substrate a graphene layer that includes a plurality of nanocrystal graphenes, forming a semiconductor layer on the graphene layer, separating the first substrate from the graphene layer, and transferring the graphene layer and the semiconductor layer to a second substrate that is more flexible than the first substrate, wherein the graphene layer includes a plurality of graphenes.

In an example method as discussed above, the forming of the semiconductor layer may include coating a semiconductor solution layer in a sol-gel state on the graphene layer and annealing a resultant structure including the coated semiconductor solution layer.

According to another example embodiment, the forming of the semiconductor layer may include forming on the graphene layer an oxide film that includes at least a portion of components of the semiconductor layer, converting the oxide film into a semiconductor material film having the same material as the semiconductor layer, and growing the semiconductor material film.

The forming of the graphene layer may include forming on the first substrate a lower graphene layer that includes the plurality of nanocrystal graphenes, and forming the plurality of graphene protrusions on the lower graphene layer.

The semiconductor solution layer may be coated by using spin coating.

The coating of the semiconductor solution layer may include putting the graphene layer into a solution that includes the component of the semiconductor layer, and taking the graphene layer out from the solution.

The annealing may be low temperature annealing or high temperature annealing.

The semiconductor solution layer for the high temperature annealing such as, for example, at about 400° C. to about 1000° C., may be thicker than the semiconductor solution layer formed during the low temperature annealing such as, for example, about 250° C.

BRIEF DESCRIPTION OF THE DRAWINGS

These and/or other example embodiments will become apparent and more readily appreciated from the following description, taken in conjunction with the accompanying drawings in which.

DETAILED DESCRIPTION

Figure 1:
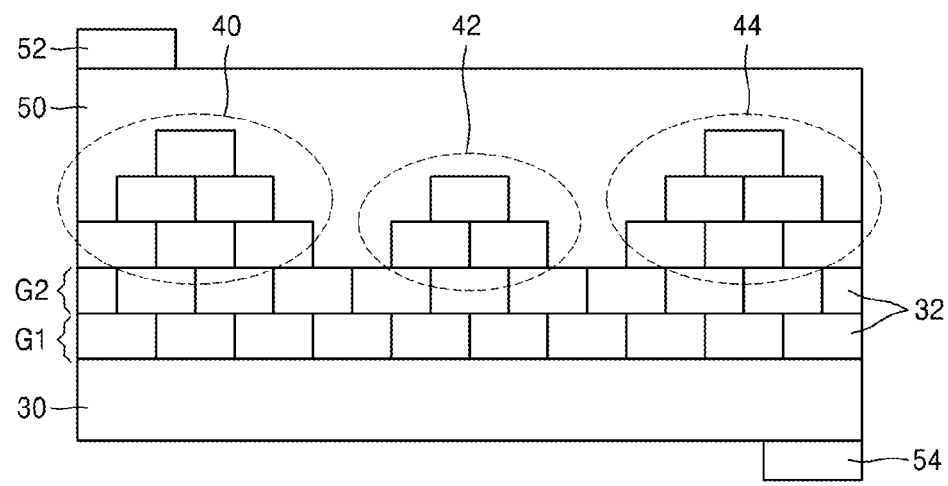
FIG. 1 is a cross-sectional view illustrating an electronic device having an increased graphene-semiconductor junction region, according to at least one example embodiment.

These and other features and advantages are described in, or are apparent from, the following detailed description of various example embodiments.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

As used herein, the term "and/or" includes any and all combinations of one or more of the associated listed items. Expressions such as "at least one of," when preceding a list of elements, modify the entire list of elements and do not modify the individual elements of the list.

Example embodiments will now be described more fully with reference to the accompanying drawings, in which example embodiments are shown. Thicknesses of layers or regions illustrated in the drawings are exaggerated for clarity. In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

First, an electronic device having an increased grapheme-semiconductor junction region according to at least one example embodiment will be explained. The electronic device may be, but is not limited to, an optical device such as a photodetector or a solar cell.

Referring to FIG. 1, the example electronic device includes a lower graphene layer on a substrate 30. The substrate 30 may be a plastic substrate, and may be a flexible substrate that is bendable. The lower graphene layer includes first and second graphene layers G1 and G2. The lower graphene layer may include a graphene layer having a single-layer structure, and may further include at least one graphene layer on the second graphene layer G2. The first graphene layer G1 may include a plurality of nanocrystal graphenes (nc-G) 32. The nc-G 32 may be or include graphene flakes. The second graphene layer G2 may be the same as or different from the first graphene layer G1.

According to at least one example embodiment, first through third graphene protrusions 40, 42, and 44 are disposed on the second graphene layer G2. The number of graphene protrusions formed on the second graphene layer G2 may be less than or greater than 3. The first through third graphene protrusions 40, 42, and 44 are spaced apart from each other. Each of the first through third graphene protrusions 40, 42, and 44 may have a multi-layer structure. For example, the first graphene protrusion 40 has a 3-layer structure, and the second graphene protrusion 42 has a 2-layer structure. The number of layers of each protrusion is not limited to 2 or 3, and may be equal to or greater than 3. Heights of the first through third graphene protrusions 40, 42, and 44 may be the same as or different from each other. For example, heights of the first and third graphene protrusions 40 and 44 may be the same, and a height of the second graphene protrusion 42 may be less than the heights of the first and third graphene protrusions 40 and 44. The height of the second graphene protrusion 42 may be greater than the first and third graphene protrusions 40 and 44. In each case, the height of the first graphene protrusion 40 may be different from the height of the third graphene protrusion 44. A width of each protrusion may vary depending on a height of each of the first through third graphene protrusions 40, 42, and 44.

According to at least one example embodiment, one or more of the first through third graphene protrusions 40, 42, and 44 includes a plurality of nanocrystal graphenes. Each of the first through third graphene protrusions 40, 42, and 44 has a pyramidal shape, and a side surface of each of the first through third graphene protrusions 40, 42, and 44 may be uneven. For example, each of the first through third graphene protrusions 40, 42, and 44 may have a stepped side surface. Accordingly, the area of a side surface of each of the first through third graphene protrusions 40, 42, and 44 is greater than when each of the first through third graphene protrusions 40, 42, and 44 has a flat side surface, that is, a non-stepped side surface. Hence, when a semiconductor layer 50 covers the first through third graphene protrusions 40, 42, and 44, a junction area between the semiconductor layer 50 and the first through third graphene protrusions 40, 42, and 44 may be increased. The lower graphene layer and the first through third graphene protrusions 40, 42, and 44 may be collectively referred to as a graphene layer.

According to at least one example embodiment, the semiconductor layer 50 covering the first through third graphene protrusions 40, 42, and 44 is provided on the second graphene layer G2. The semiconductor layer 50 contacts a top surface and a stepped side surface of each of the first through third graphene protrusions 40, 42, and 44. Also, the semiconductor layer 50 contacts a top surface of the lower graphene layer between the first through third graphene protrusions 40, 42, and 44. The semiconductor layer 50 fills a space between the first through third graphene protrusions 40, 42, and 44. A thickness of the semiconductor layer 50 may be greater than a height of the highest graphene protrusion. A top surface of the semiconductor layer 50 may be flat. The semiconductor layer 50 may be a transition metal dichalcogenide (TMDC) layer. The TMDC layer may be, for example, a $MX_2$ layer. Here, M may be, for example, molybdenum (Mo) or tungsten (W). X may be, for example, sulfur (S) or selenium (Se). A first electrode 52 is disposed on the semiconductor layer 50. The first electrode 52 may be formed of, for example, gold (Au), but the example embodiments are not limited thereto and any of other electrode materials may be used. A second electrode 54 is disposed on a bottom surface of the substrate 30. The second electrode 54 may be formed of, for example, titanium (Ti), but the example embodiments are not limited thereto as other electrode materials may be used, and the second electrode 54 may be formed of the same material as the material of the first electrode 52. When the electronic device of FIG. 1 is an optical device, since the semiconductor layer 50 and a stepped side surface of each of the first through third graphene protrusions 40, 42, and 44 contact each other, which increases a contact area between the semiconductor layer 50 and a metal layer under the semiconductor layer 50, that is, the graphene layer, more optical current than in a conventional art may be generated. Accordingly, if the optical device is a photodetector, the photodetector may have high detection efficiency, and if the optical device is a solar cell, the solar cell may have high photoelectric conversion efficiency.

Figure 2:
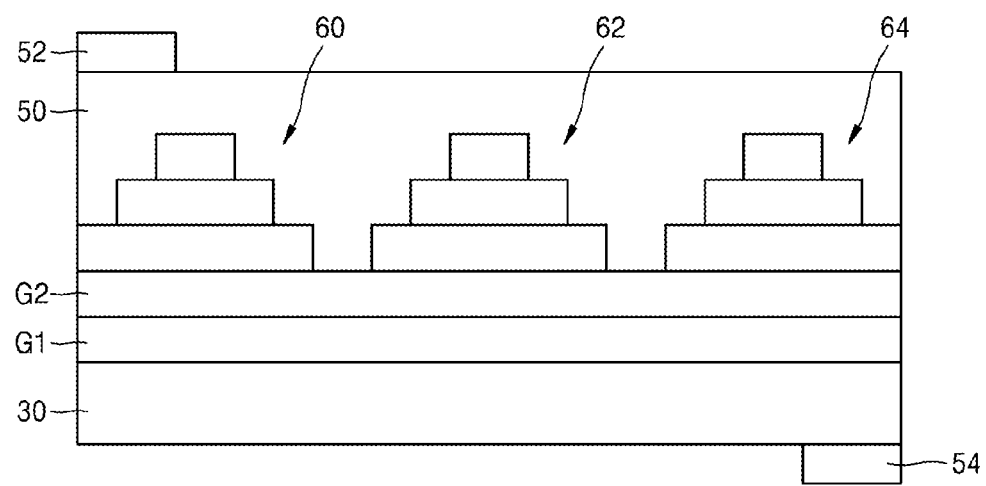
FIG. 2 is a cross-sectional view illustrating a case where heights of protrusions of a graphene layer of FIG. 1 are substantially the same.

FIG. 2 is a cross-sectional view illustrating an electronic device according to another example embodiment. The following will focus on the difference from FIG. 1 and the same reference numerals denote the same members. Also, for convenience, each of the first and second graphene layers G1 and G2 is shown to have a one-layer structure and a plurality of nanocrystal graphenes included in each layer are not shown.

Referring to FIG. 2, fourth through sixth graphene protrusions 60, 62, and 64 are on the second graphene layer G2. The fourth through sixth graphene protrusions 60, 62, and 64 are spaced apart from each other. Like the first through third graphene protrusions 40, 42, and 44 of FIG. 1, each of the fourth through sixth graphene protrusions 60, 62, and 64 may include a plurality of stacked graphene layers and one or more of the fourth through sixth graphene protrusions 60, 62, and 64 may have a stepped side surface. Each layer of the fourth through sixth graphene protrusions 60, 62, and 64 may include a plurality of nanocrystal graphenes, similarly to the first through third graphene protrusions 40, 42, and 44 of FIG. 1, and for convenience, each layer of the fourth through sixth graphene protrusions 60, 62, and 64 is shown to have one layer. Each of the fourth through sixth graphene protrusions 60, 62, and 64 may have a pyramidal shape, and may include three stacked graphene layers. The heights of the fourth through sixth graphene protrusions 60, 62, and 64 may be the same, and one or more of the fourth through sixth graphene protrusions 60, 62, and 64 may include 3 or more graphene layers, or 3 or less graphene layers.

A method of manufacturing an electronic device having a graphene-semiconductor multi-junction according to at least one example embodiment will now be explained with reference to FIGS. 3 and 4.

Figure 3:
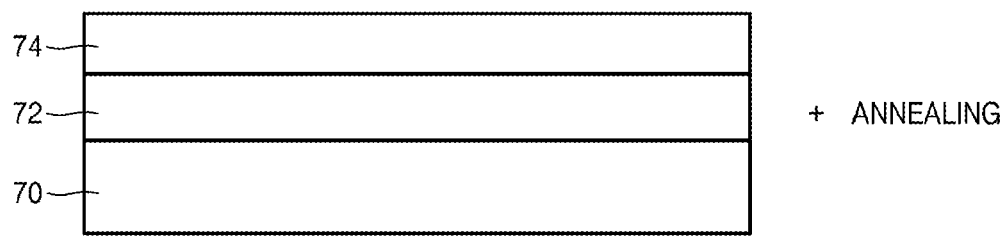
FIGS. 3 and 4 are cross-sectional views illustrating a method of manufacturing an electronic device, according to at least one example embodiment.

Referring to FIG. 3, a graphene layer 72 is formed on a first substrate 70. The first substrate 70 may be, for example, a sapphire substrate or a silicon dioxide ($SiO_2$)/silicon (Si) substrate.

The graphene layer 72 may be formed by using a general method of forming nanocrystal (nano-sized) graphene. The graphene layer 72 may include the first and second graphene layers G1 and G2 and the first through third graphene protrusions 40, 42, and 44 of FIG. 1.

The graphene layer 72 may be formed by using, but is not limited to, the following process. For example, a native oxide film of a copper foil substrate is removed (by being cleaned for 30 seconds in a 30% hydrofluoric acid (HF) solution). Next, the copper foil substrate is annealed in a quartz furnace at an atmospheric pressure for 1 hour at a temperature ranging from about 700° C. to about 900° C. During the annealing, a gas mixture of hydrogen ($H_2$) and argon (Ar) at a ratio of substantially 1:1 is supplied to the quartz furnace at a flow rate ranging from about 500 sccm (standard cubic centimeter per minute) to about 1000 sccm.

Next, the flow rate at which the amount of the gas mixture is supplied to the quartz furnace is reduced to a flow rate ranging from about 100 sccm to about 200 sccm, and then cooling is performed at room temperature. Next or after the cooling, nanocrystal graphenes are formed on the copper foil substrate by using a well-known method, and in this process, graphene layers such as the first and second graphene layers G1 and G2 and graphene protrusions are formed.

Continuously referring to FIG. 3, a semiconductor solution layer 74 in a sol-gel state is coated on the graphene layer 72. The semiconductor solution layer 74 may become a parent material of the semiconductor layer 50 of FIG. 1. The semiconductor solution layer 74 may be, for example, a TMDC solution layer for forming a TMDC layer. The semiconductor solution layer 74 may be a solution including a material for forming the semiconductor layer 50 of FIG. 1. The semiconductor solution layer 74 may be coated by using any of various methods, for example, spin coating typically used in a process of manufacturing a semiconductor device, or dipping. The dipping involves putting the first substrate 70 on which the graphene layer 72 is formed into a container in which a semiconductor source solution is filled and taking the first substrate 70 out from the container. The semiconductor source solution filled in the container may be, for example, $(NH_4)_2MoS_4$+DMF (0.1 M) where DMF stands for dimethyl formamide.

According to at least one example embodiment, a resultant structure obtained after the semiconductor solution layer 74 is coated is annealed. When the annealing is a relatively low temperature process, an annealing temperature may be, for example, about 250° C. When the annealing is a relatively high temperature process, an annealing temperature may be, for example, 400° C. or more, and may range from about 400° C. to about 1000° C. The semiconductor solution layer 74 formed when the annealing is performed as a high temperature process may be thicker than the semiconductor solution layer 74 formed when the annealing is performed as a low temperature process. Due to the annealing, components other than a semiconductor component are removed from the semiconductor solution layer 74. The annealing may be performed in, for example, a furnace. While the annealing is performed in the furnace, $H_2S$ may be supplied to the furnace at a flow rate of 25 sccm and a $H_2/Ar$ gas may be supplied to the furnace at a flow rate of 100 sccm. The $H_2/Ar$ gas may be supplied at a ratio of 1:4. A pressure of the furnace during the annealing may be, for example, about 1 torr.

Figure 4:
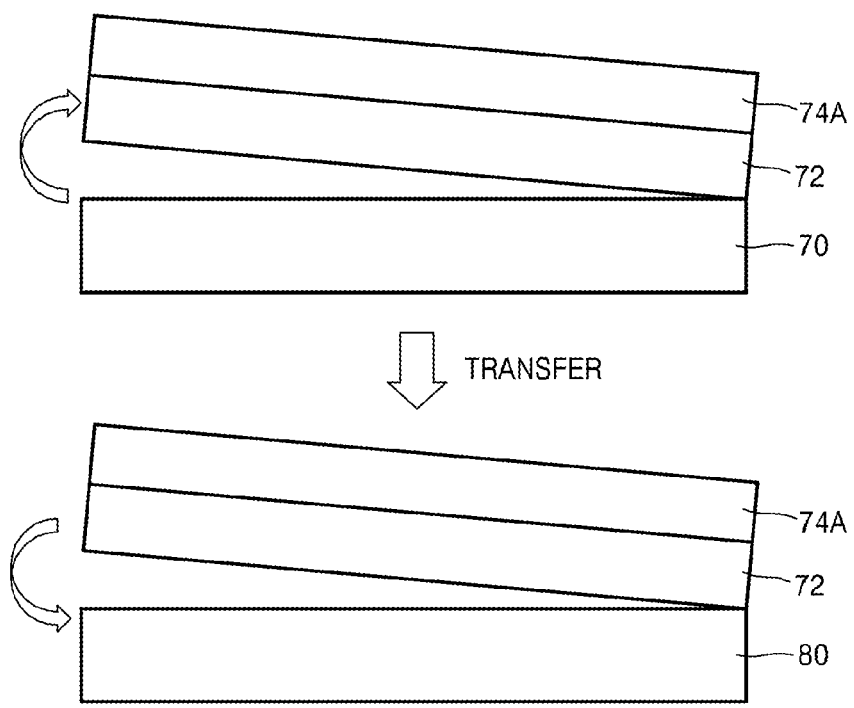

As a result of the annealing, a semiconductor layer 74A is formed on the graphene layer 72 as shown in FIG. 4. The semiconductor layer 74A may be formed of the same material as the material of the semiconductor layer 50 of FIG. 1.

After the annealing is completed, the first substrate 70 is separated or removed from the graphene layer 72 and the semiconductor layer 74A. The separation or removal of the first substrate 70 may be performed by coating a support layer on the graphene layer 72 and etching the first substrate 70.

The graphene layer 72 and the semiconductor layer 74A separated from the first substrate 70 are transferred to a second substrate 80. The second substrate 80 may be a flexible substrate, unlike the first substrate 70. The second substrate 80 may be, for example, a plastic substrate that is bendable.

Figure 5:
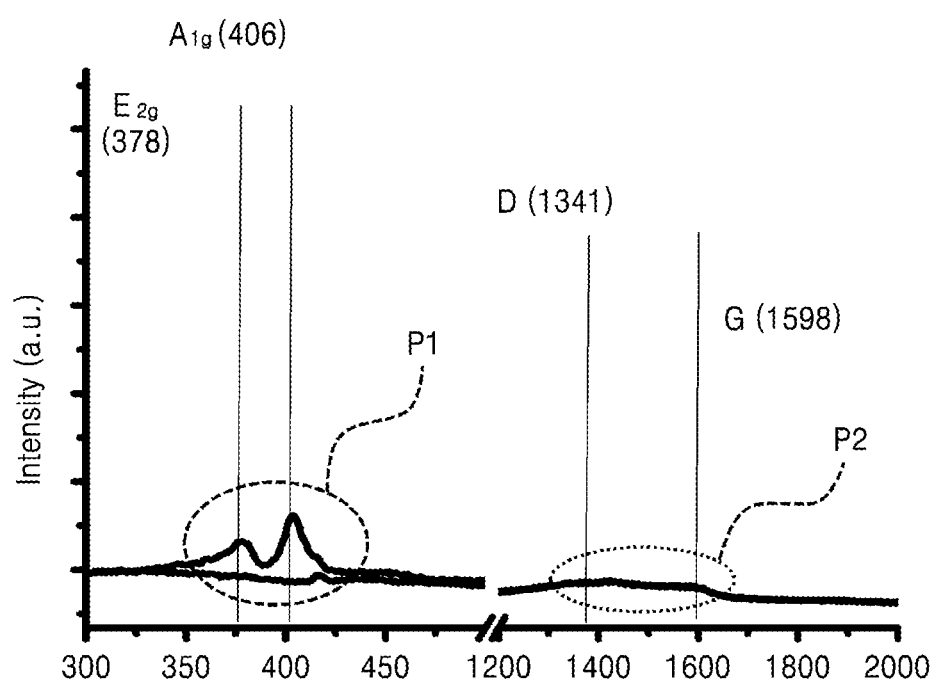
FIG. 5 is a graph illustrating a Raman shift for a resultant structure obtained through low-temperature annealing in the example method illustrated at FIGS. 3 and 4.

FIG. 5 is a graph illustrating a Raman shift for a resultant structure obtained by performing low-temperature annealing on the semiconductor solution layer 74 (at a temperature of about 250° C.) in the method of FIGS. 3 and 4, according to at least one example embodiment. In FIG. 5, the horizontal axis represents a Raman shift, and the vertical axis represents an intensity.

In an experiment for obtaining a result of FIG. 5, a $MoS_2$ layer was used as the semiconductor layer 74A. In FIG. 5, a first peak P1 is a peak indicating the existence of a component of $MoS_2$ used as the semiconductor layer 74A. A second peak P2 is a peak indicating the existence of the graphene layer 72 including nanocrystal graphenes.

As shown in FIG. 5, since the existence of $MoS_2$ (see the first peak P1) is observed along with the existence of the graphene layer 72 (see the second peak P2) in the resultant structure obtained by performing low-temperature annealing on the semiconductor solution layer 74, it is determined that a TMDC layer is formed on the graphene layer 72 due to the low-temperature annealing.

Figure 6:
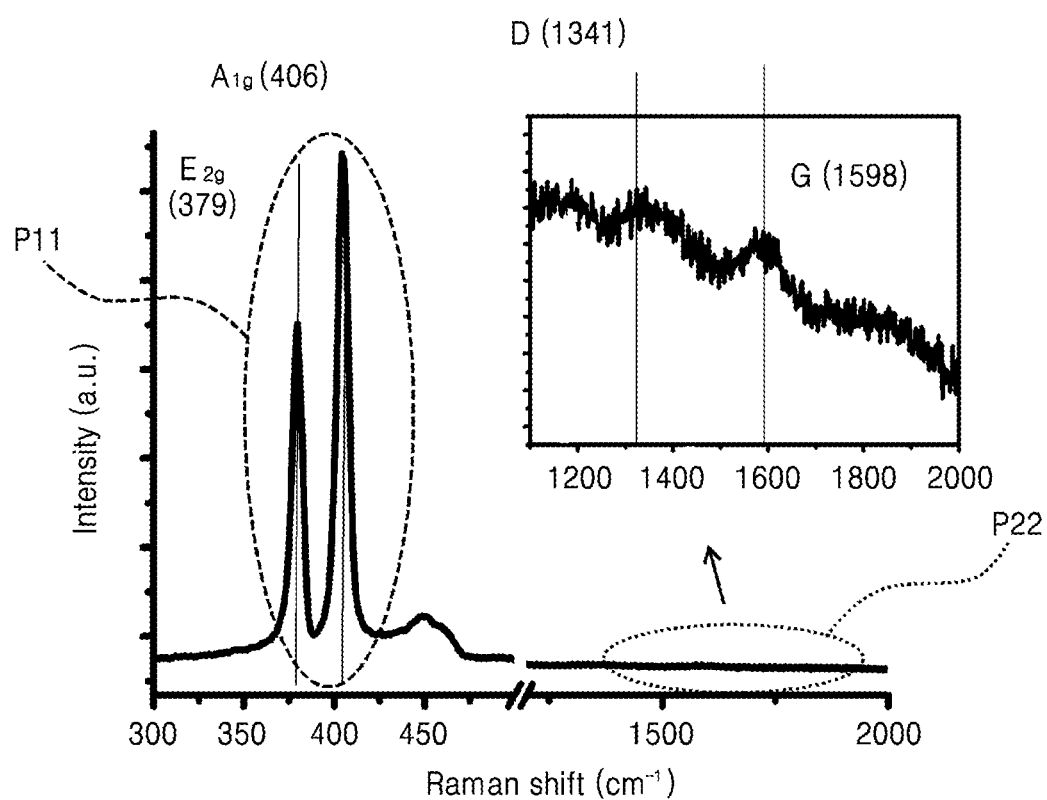
FIG. 6 is a graph illustrating a Raman shift for a resultant structure obtained through high-temperature annealing in the example method illustrated at FIGS. 3 and 4.

FIG. 6 is a graph illustrating a Raman shift for a resultant structure obtained by performing relatively high-temperature annealing on the semiconductor solution layer 74 (at a temperature ranging from about 400° C. to about 1000° C.) in the method of FIGS. 3 and 4, according to at least one example embodiment. In FIG. 6, the horizontal axis represents a Raman shift, and the vertical axis represents an intensity. In an experiment for obtaining a result of FIG. 6, a $MoS_2$ layer was used as the semiconductor layer 74A. In FIG. 6, a first peak P11 is a peak indicating the existence of a component of $MoS_2$ used as the semiconductor layer 74A. A second peak P22 is a peak indicating the existence of the graphene layer 72 including nanocrystal graphenes.

As shown in FIG. 6, since the existence of $MoS_2$ (see the first peak P11) is observed along with the existence of the graphene layer 72 (see the second peak P22) even in the resultant structure obtained by performing high-temperature annealing on the semiconductor solution layer 74, it is determined that a TMDC layer is formed on the graphene layer 72 even due to the high-temperature annealing. When the first peak P1 of FIG. 5 and the first peak P11 of FIG. 6 are compared with each other, an intensity of the first peak P11 of FIG. 6 is higher than an intensity of the first peak P1 of FIG. 5. This means that the degree of crystallinity of a TMDC layer during high-temperature annealing is higher than the degree of crystallinity of the TMDC layer during low-temperature annealing.

A method of manufacturing an electronic device having a graphene-semiconductor multi-junction according to another example embodiment will now be explained with reference to FIGS. 7A through 9B. The same elements as those illustrated in FIGS. 3 and 4 are denoted by the same reference numerals.

Figure 7A:
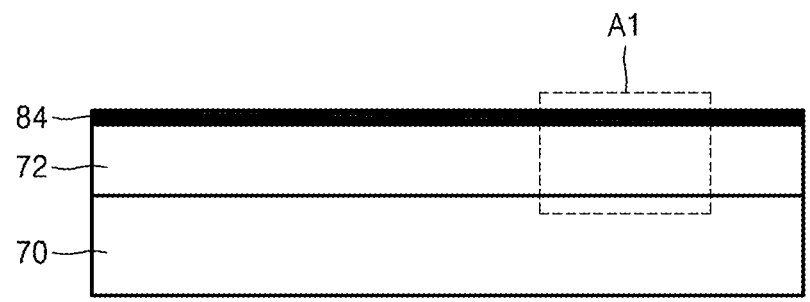
FIGS. 7A through 11 are cross-sectional views for explaining a method of manufacturing an electronic device, according to another example embodiment.
Figure 7B:
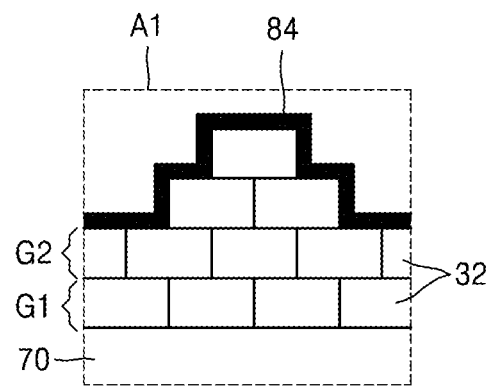

Referring to FIGS. 7a and 7b, the graphene layer 72 is formed on the first substrate 70. An oxide film 84 is formed on the graphene layer 72. FIG. 7b is an enlarged cross-sectional view illustrating a first portion A1 of FIG. 7a.

Referring to FIG. 7b, the oxide film 84 covers a top surface of the second graphene layer G2. Also, the oxide film 84 covers a top surface and a stepped side surface of each one of the graphene protrusions that are disposed on the second graphene layer G2. After the oxide film 84 is formed, an outline of the stepped side surface of each of the graphene protrusions may remain on the oxide film 84. The oxide film 84 may be formed by using thermal evaporation. A thickness of the oxide film 84 may range, for example, from about 15 nm to about 30 nm. The oxide film 84 may be an oxide film including M of a $MX_2$ layer (M and X may be the same as described with reference to FIG. 1) used as the semiconductor layer 50 of FIG. 1. For example, the oxide film 84 may be a MoO$_x$ film (wherein x ranges from 1 to 3).

Figure 8A:
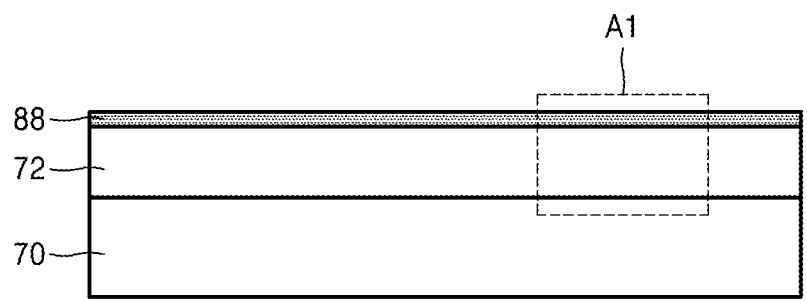
Figure 8B:
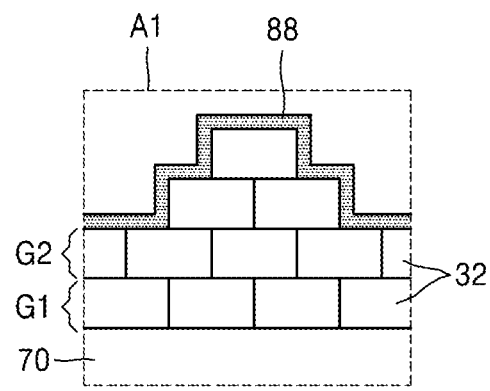
Figure 9A:
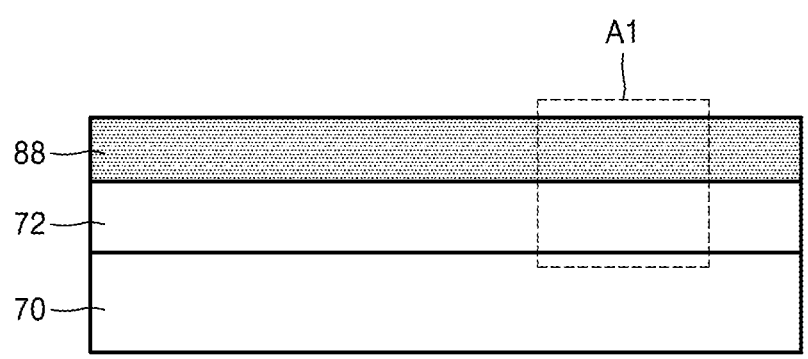
Figure 9B:
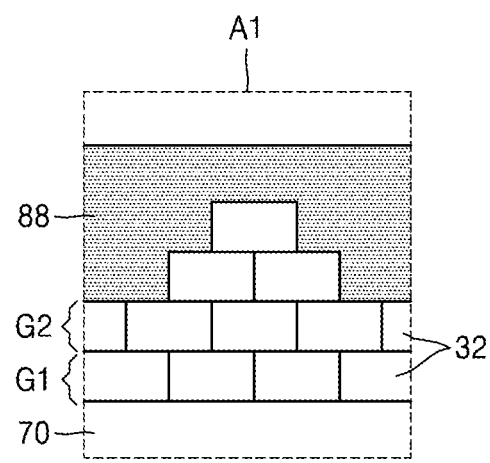

Next, as shown in FIGS. 8a and 8b, a semiconductor layer 88 is formed on the graphene layer 72. The semiconductor layer 88 may be formed by converting the oxide film 84 of FIGS. 7a and 7b. A process of converting the oxide film 84 into the semiconductor layer 88 may be performed by causing the oxide film 84 that is formed on the first substrate 70 to react with a source gas. The source gas may be a gas including X of, for example, a MX$_2$ layer used as the semiconductor layer 50. The source gas may be a hydrogen chalcogenide gas (for example, H$_2$S, H$_2$Se, or H$_2$Te) or a vapor obtained by heating chalcogen powder. The source gas may be supplied at a flow rate ranging from, for example, about 1 sccm to about 100 sccm. The reaction between the source gas and the oxide film 84 is chalcogenization reaction. Due to the chalcogenization, oxygen of the oxide film 84 is displaced by X included in the source gas. As a result, a semiconductor material film having the same material as the semiconductor layer 88, that is, the semiconductor layer 88 is formed on the graphene layer 72.

According to at least one example embodiment, after the oxide film 84 is converted into the semiconductor layer 88, the semiconductor layer 88 is continuously grown by supplying the source gas and a gas including element M to the semiconductor layer 88. The semiconductor layer 88 may be grown until a thickness of the semiconductor layer 88 between graphene protrusions is greater than the heights of the graphene protrusions. A top surface of the semiconductor layer 88 may be planarized. A process of forming the semiconductor layer 88 may be performed at a desired, or alternatively predetermined temperature, for example, a temperature ranging from about 400° C. to about 1000° C. The semiconductor layer 88 may be the semiconductor layer 50 of FIG. 1.

Figure 10:
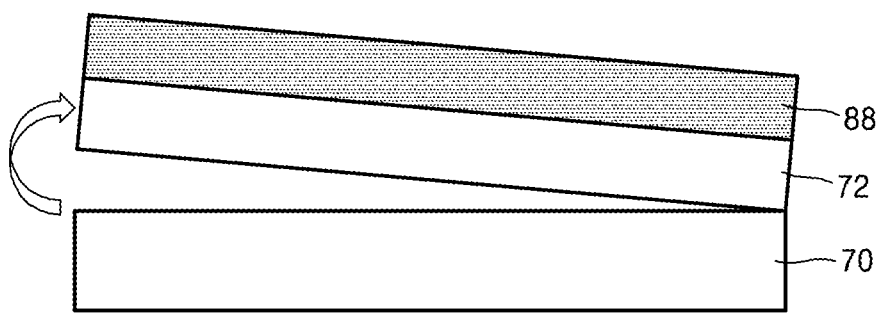

Next or after the semiconductor layer 88 is formed, as shown in FIG. 10, the first substrate 70 is separated from the graphene layer 72. Alternatively, the graphene layer 72 and the semiconductor layer 88 are separated from the first substrate 70.

Figure 11:
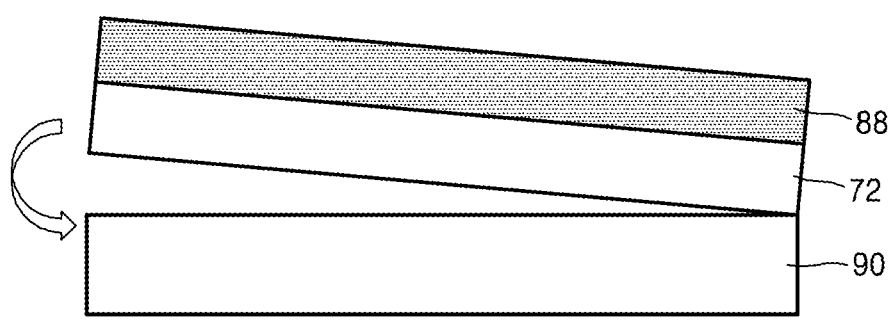

Next, as shown in FIG. 11, the graphene layer 72 and the semiconductor layer 88 are transferred to a second substrate 90. The second substrate 90 may be a flexible substrate. The second substrate 90 may have the same characteristics as the characteristics of the substrate 30 of FIG. 1, or similar characteristics to the characteristics of the substrate 30 of FIG. 1. Next, electrodes corresponding to the first and second electrodes 52 and 54 of FIG. 1 may be formed.

According to the one or more example embodiments, in an electronic device having a graphene-semiconductor multi-junction, a semiconductor layer is disposed on a graphene layer. The graphene layer may have a multi-layer structure, and may have a plurality of graphene protrusions that protrude toward the semiconductor layer. One or more of the graphene protrusions may have a multi-layer structure formed of graphene, and may have a stepped edge. That is, one or more of the graphene protrusions may have a multi-edge. Since the semiconductor layer contacts the multi-edge of each of the graphene protrusions, a contact region between the graphene layer and the semiconductor layer is substantially larger than the contact region in the conventional art. Accordingly, current efficiency of the electronic device is higher than the current efficiency in the conventional art. For example, when the electronic device is a solar cell, more optical current than in the conventional art may be generated.

While one or more example embodiments have been described with reference to the figures, it will be understood by those of ordinary skill in the art that various changes in form and details may be made therein without departing from the spirit and scope defined by the following claims.

What is claimed is:

1. An electronic device comprising:
    a substrate;
    a graphene layer on the substrate; and
    a semiconductor layer covering the graphene layer,
    wherein the graphene layer includes a plurality of nanocrystal graphenes and a plurality of graphene protrusions, the graphene protrusions extending away from the graphene layer in an opposite direction to the substrate and including the nanocrystal graphenes in a stacking configuration and spaced apart from each other,
    wherein the graphene protrusions are connected to each other by the plurality of nanocrystal graphenes.

2. The electronic device of claim 1, wherein a side surface of one or more of the plurality of graphene protrusions is uneven.

3. The electronic device of claim 2, wherein one or more of the plurality of graphene protrusions has a stepped side surface.

4. The electronic device of claim 1, wherein one or more of the plurality of graphene protrusions comprises a plurality of nanocrystal graphenes.

5. The electronic device of claim 1, wherein heights of the plurality of graphene protrusions are different from each other.

6. The electronic device of claim 1, wherein the substrate is a flexible substrate.

7. The electronic device of claim 1, wherein the semiconductor layer comprises a transition metal dichalcogenide (TMDC) layer.

8. The electronic device of claim 1, wherein the graphene layer comprises:
    a lower graphene layer including the plurality of nanocrystal graphenes; and
    the plurality of graphene protrusions on the lower graphene layer.

9. The electronic device of claim 8, wherein the lower graphene layer comprises first and second graphene layers stacked on each other.

10. The electronic device of claim 1, wherein the semiconductor layer is in direct contact with the graphene layer.

11. The electronic device of claim 1, wherein the graphene protrusions have a tapered configuration with lower layers being larger than upper layers.

12. The electronic device of claim 1, wherein the graphene protrusions have a pyramidal configuration.

13. The electronic device of claim 1, wherein the graphene protrusions have a substantially symmetrical configuration.

14. A method of manufacturing an electronic device, the method comprising:
    forming on a first substrate a graphene layer that includes a plurality of nanocrystal graphenes;
    forming a semiconductor layer on the graphene layer;
    separating the first substrate from the graphene layer; and
    transferring the graphene layer and the semiconductor layer to a second substrate that is more flexible than the first substrate,
    wherein the graphene layer includes a plurality of graphene protrusions, the graphene protrusions extending away from the graphene layer in an opposite direction to the substrate and including the nanocrystal graphenes in a stacking configuration and spaced apart from each other,
wherein the graphene protrusions are connected to each other by the plurality of the nanocrystal graphenes.

15. The method of claim 14, wherein the forming of the semiconductor layer comprises:
coating a semiconductor solution layer in a sol-gel state on the graphene layer; and
annealing the graphene layer coated with the semiconductor solution layer.

16. The method of claim 14, wherein the forming of the semiconductor layer comprises:
forming on the graphene layer an oxide film that includes at least one portion of components of the semiconductor layer;
converting the oxide film into a semiconductor material film having a same material as the semiconductor layer; and
growing the semiconductor material film.

17. The method of claim 14, wherein the semiconductor layer comprises a transition metal dichalcogenide (TMDC) layer.

18. The method of claim 14, wherein the forming of the graphene layer comprises:
forming on the first substrate a lower graphene layer including the plurality of nanocrystal graphenes; and
forming the plurality of graphene protrusions on the lower graphene layer.

19. The method of claim 15, wherein the semiconductor solution layer is coated via spin coating.

20. The method of claim 15, wherein the coating of the semiconductor solution layer comprises providing the graphene layer in a solution that includes a component of the semiconductor layer and removing the graphene layer from the solution.

21. The method of claim 15, wherein the annealing is one of low-temperature annealing performed at substantially 250° C. and high-temperature annealing performed in a range of about 400° C. to about 1000° C.

22. The method of claim 21, wherein the semiconductor solution layer for the high-temperature annealing is thicker than the semiconductor solution layer for the low-temperature annealing.

23. The method of claim 14, wherein a side surface of one or more of the plurality of graphene protrusions is uneven.

24. The method of claim 23, wherein one or more of the plurality of graphene protrusions has a stepped side surface.

25. The method of claim 14, wherein the semiconductor layer is in direct contact with the graphene layer.

* * * * *